United States Patent
Fukuda et al.

(10) Patent No.: US 8,258,817 B2
(45) Date of Patent: Sep. 4, 2012

(54) SEMICONDUCTOR INTEGRATED CIRCUIT

(75) Inventors: Ryo Fukuda, Yokohama (JP); Masaru Koyanagi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 12/884,623

(22) Filed: Sep. 17, 2010

(65) Prior Publication Data

US 2011/0128073 A1 Jun. 2, 2011

(30) Foreign Application Priority Data

Nov. 30, 2009 (JP) .................................. 2009-272773

(51) Int. Cl.
*H03K 5/153* (2006.01)

(52) U.S. Cl. ............... 327/77; 327/85; 327/87; 327/108

(58) Field of Classification Search ................ 327/77, 327/78, 85, 87, 108, 427; 326/82, 83
See application file for complete search history.

(56) References Cited

U.S. PATENT DOCUMENTS 7,436,732 B2 * 10/2008 Hirobe .......................... 365/226

FOREIGN PATENT DOCUMENTS

JP 2005-130332 5/2005

* cited by examiner

*Primary Examiner* — Long Nguyen
(74) *Attorney, Agent, or Firm* — Oblon, Spivak, McClelland, Maier & Neustadt, L.L.P.

(57) ABSTRACT

According to one embodiment, a semiconductor integrated circuit includes first to six transistors and a constant current source circuit. The first and second transistors form a current mirror circuit connected to a first power source node. The third and fourth transistors form a differential pair circuit. The third and fourth transistors receive first and second external signals at their gates, respectively. The constant current source circuit has one end connected to source terminals of the third and fourth transistors, and the other end connected to a second power source node. The fifth and sixth transistors form a current pathway between a common gate node of the first and second transistors and the constant current source circuit. The gate of fifth transistor is connected to a signal output node. The gate of sixth transistor receives a signal of logic opposite to a signal to be obtained at the signal output node.

8 Claims, 8 Drawing Sheets

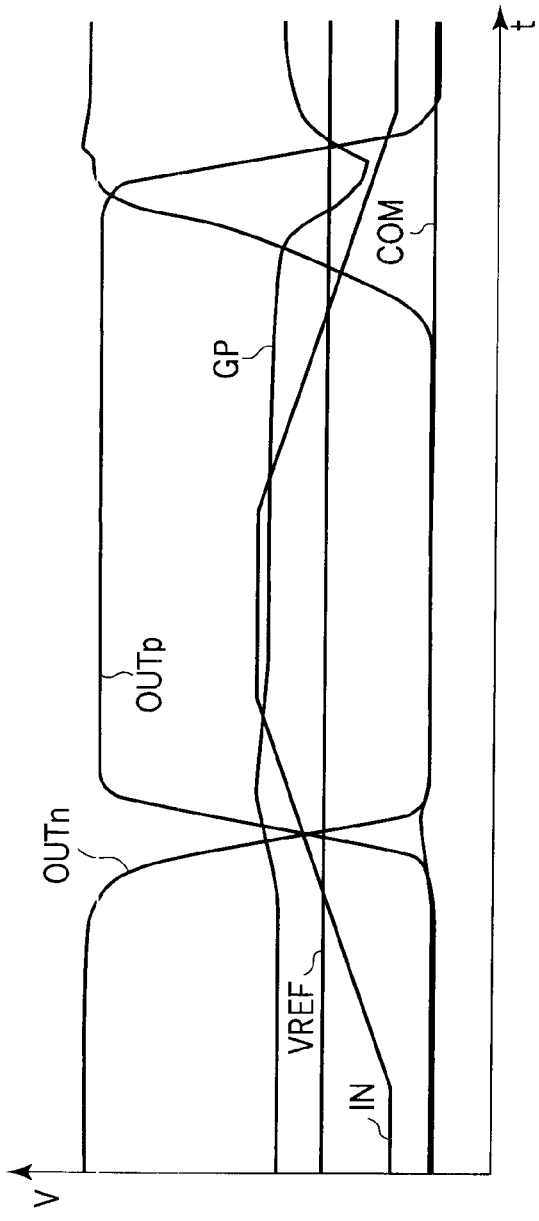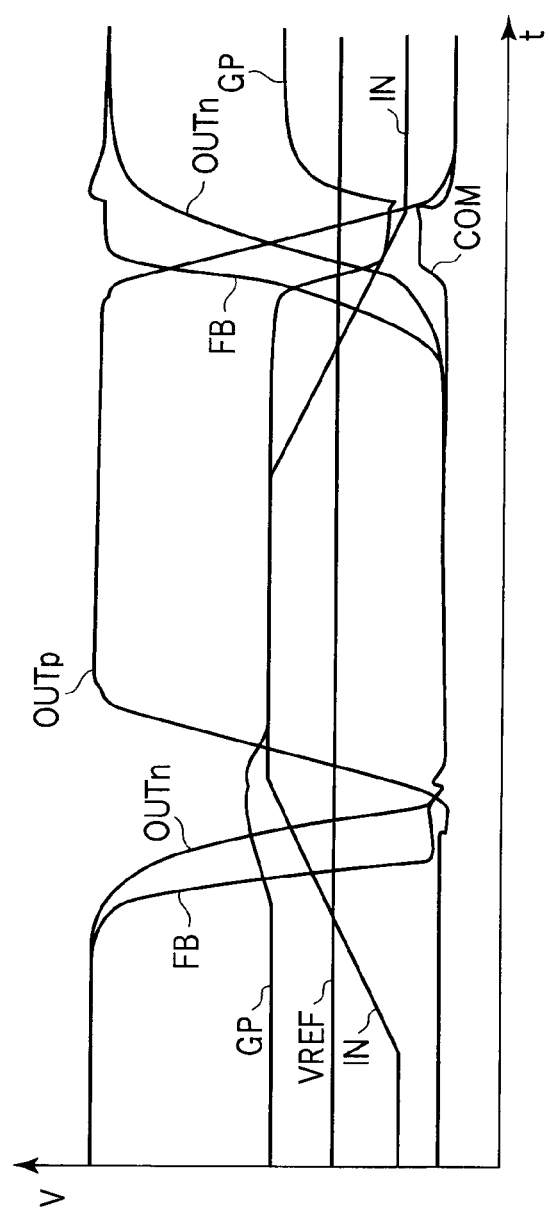
F I G. 2
F I G. 4

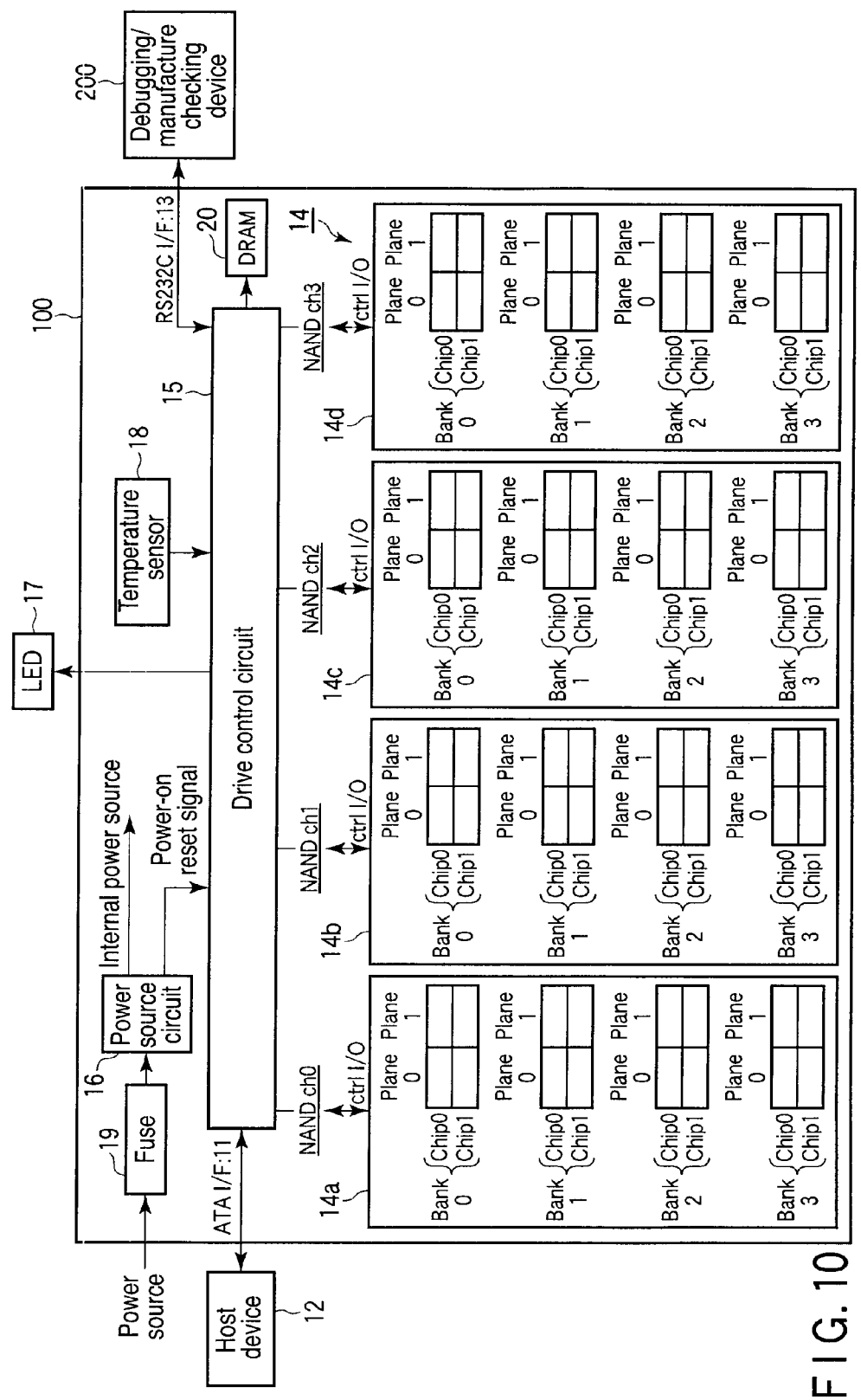
F I G. 10

SEMICONDUCTOR INTEGRATED CIRCUIT

CROSS-REFERENCE TO RELATED APPLICATIONS

This application is based upon and claims the benefit of priority from Japanese Patent Application No. 2009-272773, filed Nov. 30, 2009; the entire contents of which are incorporated herein by reference.

FIELD

Embodiments described herein relate generally to a semiconductor integrated circuit provided with an input receiver configured to receive an external input signal.

BACKGROUND

In an I/O input receiver on a semiconductor integrated circuit, in order to make it possible to receive an external minute amplitude, a current-mirror differential amplifier is used in many cases. Although the differential amplifier is generally used to compare two signals with each other, there are two cases, i.e., a case where differential signals are compared with each other, and case where an input signal of a system is compared with fixed potential.

In the case where the differential signals are compared with each other, comparison of equal signals is carried out, and hence the characteristics of the circuit become better, and the performance is improved. However, two external interconnects are required for a one bit input signal, and hence disadvantages such as an increase in the number of interconnects, increase in the power consumption, and the like are increased.

On the other hand, in the case where the input signal of a system is compared with the fixed potential, common fixed potential can be shared by a plurality of I/Os, and hence there is an advantage that the number of interconnects can be small, and disadvantage that the circuit performance is reduced because of the asymmetry of the signals.

An input receiver in which a current-mirror differential amplifier is used is generally constituted of a current-mirror differential amplifier, and inverter in the subsequent stage is configured to carry out waveform shaping of an output of the current-mirror differential amplifier. The current-mirror differential amplifier includes a pair of first and second PMOS transistors constituting a current mirror circuit, a pair of first and second NMOS transistors each of which is connected to each of the first and second PMOS transistors in series, and which constitute a differential pair circuit, and NMOS transistor TNCS used for a constant current source. Fixed potential reference potential) VREF which is an external input signal is input to a gate terminal of the first NMOS transistor TNA1, and an input signal IN that is an external input signal is input to a gate terminal of the second NMOS transistor TNA2. An output signal OUTn of the current-mirror differential amplifier is output from a signal output node which is a common connection node of a drain terminal of the second PMOS transistor TPM2 and a drain terminal of the second NMOS transistor TNA2.

In the conventional circuit having the configuration described above, when the external input signal IN rises from "L" to "H", the potential of the node of the output signal OUTn is quickly discharged through the second NMOS transistor TNA2, and hence the potential of the output signal OUTn quickly lowers to "L".

However, when the external input signal IN falls from "H" to "L", an operation in which the potential of the common connection node of a gate terminal of the first PMOS transistor TPM1, and gate terminal of the second PMOS transistor TPM2 is lowered through the first NMOS transistor TNA1, the current flowing through the second PMOS transistor TPM2 increases, and a node of the output signal OUTn is charged is carried out, and hence a signal transition speed of the output signal OUTn at the time at which the signal OUTn rises to "H" becomes lower than when the potential of the output signal OUTn lowers to "L".

As described above, in the conventional input receiver in which the current-mirror differential amplifier is used, a transition time difference of the output signal occurs between the rise time and fall time of the input signal. As a result of this, in a circuit in which a signal received by an input receiver is used, it is necessary to carry out setup/hold in accordance with the timing of later transition time, and hence there is the problem that a margin of the setup/hold lowers.

It should be noted that in Jpn. Pat. Appln. KOKAI Publication No. 2005-130332, a differential amplifier configured to output a maximum of four multivalued voltage levels for two input voltages is disclosed.

BRIEF DESCRIPTION OF THE DRAWINGS

FIG. 2 is a waveform chart showing changes in potential of main parts of the input receiver shown in FIG. 1.

FIG. 4 is a waveform chart showing changes in potential of main parts of the input receiver shown in FIG. 3.

FIG. 10 is a block diagram showing a configuration example of an SSD to which the semiconductor integrated circuit according to each of the above-mentioned embodiments is applied.

DETAILED DESCRIPTION

In general, according to one embodiment, a semiconductor integrated circuit includes a first transistor, a second transistor, a third transistor, a fourth transistor, a first constant current source circuit, a fifth transistor and a sixth transistor. The first transistor is of a first channel type a source terminal of which is connected to a first power source node, a gate terminal and a drain terminal of which are connected to a first node. The second transistor is of the first channel type a source terminal of which is connected to the first power source node, a drain terminal of which is connected to a signal output node, a gate terminal of which is connected to the first node, and which constitutes a current mirror circuit together with the first transistor. The third transistor is of a second channel type a drain terminal of which is connected to the drain terminal of the first transistor, and to a gate terminal of which a first external signal is input. The fourth transistor is of the second channel type a drain terminal of which is connected to the signal output terminal, a source terminal of which is connected to a source terminal of the third transistor, to a gate terminal of which a second external signal is input, and which constitutes a differential pair circuit together with the third transistor. The first constant current source circuit has one end connected to the source terminals of the third and fourth transistors, and the other end connected to a second power source node. The fifth transistor is of the second channel type a current pathway of which between a source terminal and a drain terminal is inserted between the first node and the one end of the first constant current source circuit, and a gate terminal of which is connected to the signal output node. The sixth transistor is of the second channel type a current pathway of which between a source terminal and a drain terminal is connected in series to the current pathway between the source terminal and the drain terminal of the fifth transistor, and to a gate terminal of which a signal of logic opposite to a signal to be obtained at the signal output node is input.

Embodiments will be hereinafter described with reference to the drawings. In describing the embodiments, the corresponding parts are denoted by the same reference symbols to be described.

First Embodiment

Figure 1:
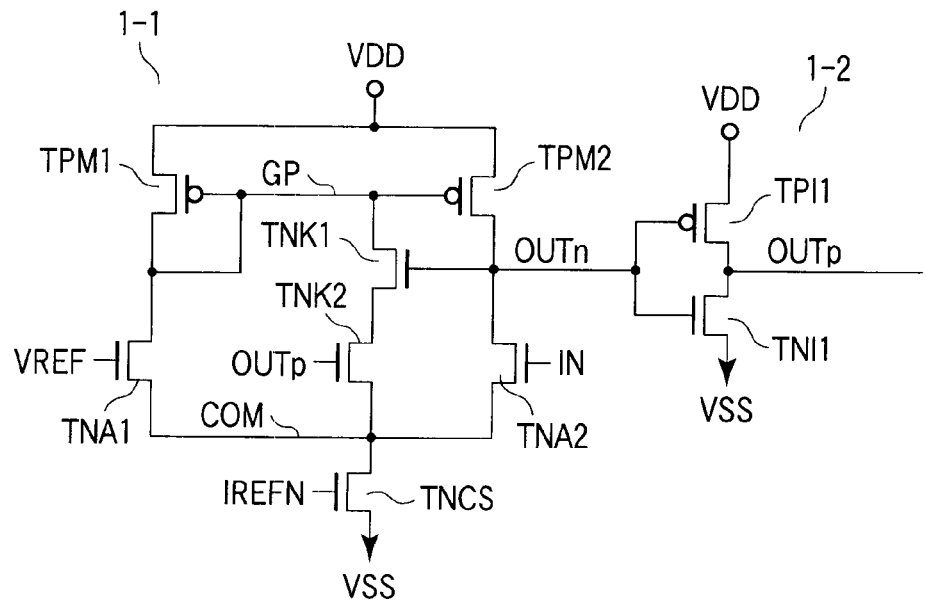
FIG. 1 is a circuit diagram showing the configuration of an input receiver provided on a semiconductor integrated circuit according to a first embodiment.

FIG. 1 is a circuit diagram showing the configuration of an input receiver provided on a semiconductor integrated circuit according to a first embodiment. The input receiver of FIG. 1 is constituted of a current-mirror differential amplifier 1-1, and inverter 1-2 in the subsequent stage configured to carry out waveform shaping of an output signal of the current-mirror differential amplifier 1-1.

The current-mirror differential amplifier 1-1 includes a pair of PMOS transistors TPM1 and TPM2 constituting a current mirror circuit, a pair of NMOS transistors TNA1 and TNA2 constituting a differential pair circuit, and NMOS transistor TNCS used for a constant current source circuit. Two NMOS transistors TNK1 and TNK2 are further added to the current-mirror differential amplifier 1-1.

A source terminal of the PMOS transistor TPM1 is connected to a first power source node to which a power source voltage VDD of the positive polarity is supplied, and gate terminal and drain terminal thereof are connected to a common connection node GP of the gate terminal of the PMOS transistor TPM1, and a gate terminal of the PMOS transistor TPM2. A source terminal of the PMOS transistor TPM2 is connected to the first power source node, drain terminal thereof is connected to a signal output node configured to acquire an output signal OUTn of the differential amplifier 1-1, and gate terminal thereof is connected to the node GP. A drain terminal of the NMOS transistor TNA1 is connected to the drain terminal of the PMOS transistor TPM1, and fixed potential VREF which is a first external signal is input to a gate terminal thereof. A drain terminal of the NMOS transistor TNA2 is connected to a signal output node configured to acquire an output signal OUTn, source terminal thereof is connected to a source terminal of the NMOS transistor TNA1, and an input signal IN which is a second external signal is input to a gate terminal thereof. A drain terminal of the NMOS transistor TNCS is connected to a node COM which is a common connection node of the drain terminal of the NMOS transistor TNA1 and drain terminal of the NMOS transistor TNA2, source terminal thereof is connected to a second power source node to which a ground voltage VSS is supplied, and a desired bias voltage IREFN is input to a gate terminal thereof so that a desired current can flow through the NMOS transistor TNCS.

A drain terminal of the NMOS transistor TNK1 is connected to the node GP, and the output signal OUTn obtained at the signal output node of the differential amplifier 1-1 is input to a gate terminal thereof. A drain terminal of the NMOS transistor TNK2 is connected to a source terminal of the NMOS transistor TNK1, drain terminal thereof is connected to the node COM, and an output signal OUTp of an inverter 1-2 which is a signal having logic opposite to the output signal OUTn is input to a gate terminal thereof. The NMOS transistors TNK1 and TNK2 operate as kick transistors configured to lower the potential of the node GP.

The inverter 1-2 is constituted of a PMOS transistor TP11, and NMOS transistor TN11, and the signal OUTp which has been subjected to waveform shaping is output from a signal output node which is a common connection node of a drain terminal of the PMOS transistor TP11, and drain terminal of the NMOS transistor TN11.

An operation of the input receiver shown in FIG. 1 will be described below with reference to FIG. 2. FIG. 2 is a waveform chart showing changes in potential of main parts of the input receiver shown in FIG. 1, and shows an external input signal IN, output signal OUTn of the current-mirror differential amplifier 1-1, output signal OUTp of the inverter 1-2, potential of each of the nodes GP and COM, and fixed potential VREF. The external input signal IN generally does not take a full swing corresponding to the external I/O voltage. FIG. 2 shows an example of a case where the internal power source voltage VDD is greater than the external I/O voltage. For example, the external I/O voltage is 1.8 V, and internal power source voltage VDD is 2.5 V.

When the external input signal IN is in the "L (low)" state, the output signal OUTn of the current-mirror differential amplifier 1-1 is in the "H (high)" state, and output signal OUTp of the inverter 1-2 is in the "L" state. At this time, the NMOS transistor TNK2 is in the off-state, and hence the current pathway between the node GP and node COM formed of the series circuit constituted of the NMOS transistors TNK1 and TNK2 is in the off-state.

Subsequently, when the external input signal IN changes from "L" to "H", and the potential of the signal IN exceeds the fixed potential VREF, the current flowing through the NMOS transistor TNA2 becomes greater than that flowing through the NMOS transistor TNA1, the potential of the output signal OUTn of the current-mirror differential amplifier 1-1 is lowered to be inverted from "H" to "L". Thereafter, the output signal OUTp of the inverter 1-2 is inverted from "L" to "H".

In this case, the node of the output signal OUTp is quickly discharged through the NMOS transistor TNA2, and hence the output signal OUTn of the current-mirror differential amplifier 1-1 is quickly inverted to "L", and output signal OUTp of the inverter 1-2 is also quickly inverted to "H".

When the external input signal IN is in the "H" state, the output signal OUTn of the current-mirror differential amplifier 1-1 is in the "L" state, and output signal OUTp of the inverter 1-2 is in the "H" state. At this time, although the NMOS transistor TNK1 is in the off-state, the NMOS transistor TNK2 is in the on-state.

Then, when the external input signal IN changes from "H" to "L", and the potential of the signal IN becomes lower than the fixed potential VREF, the current flowing through the NMOS transistor TNA1 becomes greater than that flowing through the NMOS transistor TNA2, and potential of the node GP is lowered. As a result of this, the current flowing through the PMOS transistor TPM2 increases, and the potential of the output signal OUTn of the current-mirror differential amplifier 1-1 rises. Further, when the potential of the signal OUTn has risen to a certain degree, the NMOS transistor TNK1 starts to be in the on-state. The NMOS transistor TNK2 is in the on-state in advance, and hence a current begins to flow through the current pathway between the node GP and node COM formed of the series circuit constituted of the NMOS transistors TNK1 and TNK2, lowering of the potential of the node GP is accelerated, and the potential of the node GP is rapidly lowered. Then, the current flowing through the NMOS transistor TNA2 becomes increasingly great, and potential of the output signal OUTn of the current-mirror differential amplifier 1-1 rapidly increases. Further, when the potential of the output signal OUTn exceeds the circuit threshold of the inverter 1-2, the output signal OUTp is inverted to "L". When the output signal OUTp of the inverter 1-2 becomes "L", the NMOS transistor TNK2 is turned off, and hence the current pathway between the node GP and node COM formed of the series circuit constituted of the NMOS transistors TNK1 and TNK2 is turned off.

As described above, in the input receiver of this embodiment, at the fall time of the external input signal IN, when the potential of the output signal OUTn of the current-mirror differential amplifier 1-1 rises a certain degree, the NMOS transistors TNK1 and TNK2 operate as kick transistors, and the potential of the node GP is lowered, and hence the rise of the output signal OUTn is accelerated. As a result of this, it is possible to make the transition time difference of the output signal between the rise time and fall time of the external input signal IN smaller than in the conventional input receiver.

It should be noted that in this embodiment, when the NMOS transistors TNK1 and TNK2 are connected between the node GP and node COM, the NMOS transistor TNK1 in which the signal OUTn is input to the gate terminal is connected on the node GP side, and NMOS transistor TNK2 in which the signal OUTp is input the gate terminal is connected on the node COM side. That is, the case where one end of the current pathway between the source terminal and drain terminal of the NMOS transistor TNK1 is connected to the node GP, one end of the current pathway between the source terminal and drain terminal of the NMOS transistor TNK2 is connected to the other end of the current pathway between the source terminal and drain terminal of the NMOS transistor TNK1, and the other end of the current pathway between the source terminal and drain terminal of the NMOS transistor TNK2 is connected to the node COM has been described. However, conversely, the circuit connection may be changed in such a manner that the NMOS transistor TNK1 is connected on the node COM side, and NMOS transistor TNK2 is connected on the node GP side.

Further, in this embodiment, although the case where the current mirror circuit is constituted of the PMOS transistors, and the differential pair circuit is constituted of the NMOS transistors has been described, the circuit may be changed in such a manner that the current mirror circuit is constituted of NMOS transistors, and the differential pair circuit is constituted of PMOS transistors.

Second Embodiment

In the input receiver of FIG. 1, the gate terminal of the NMOS transistor TNK1 which is a kick transistor is connected to the signal output node of the current-mirror differential amplifier 1-1, and the gate of the NMOS transistor TNK1 is driven by an output signal OUTn. The inverter 1-2 is connected to the signal output node of the current-mirror differential amplifier 1-1, and as the PMOS and NMOS transistors TP11 and TN11 constituting the inverter 1-2, transistors each having a large element size are used. Accordingly, large load capacity exists at the signal output node of the current-mirror differential amplifier 1-1. As a result of this, when the potential of the signal output node (output signal OUTn) of the current-mirror differential amplifier 1-1 is made to rise, the potential rise of the signal output node is restrained, and the NMOS transistor TNK1 cannot be turned on rapidly in some cases. In this embodiment, this point is improved.

Figure 3:
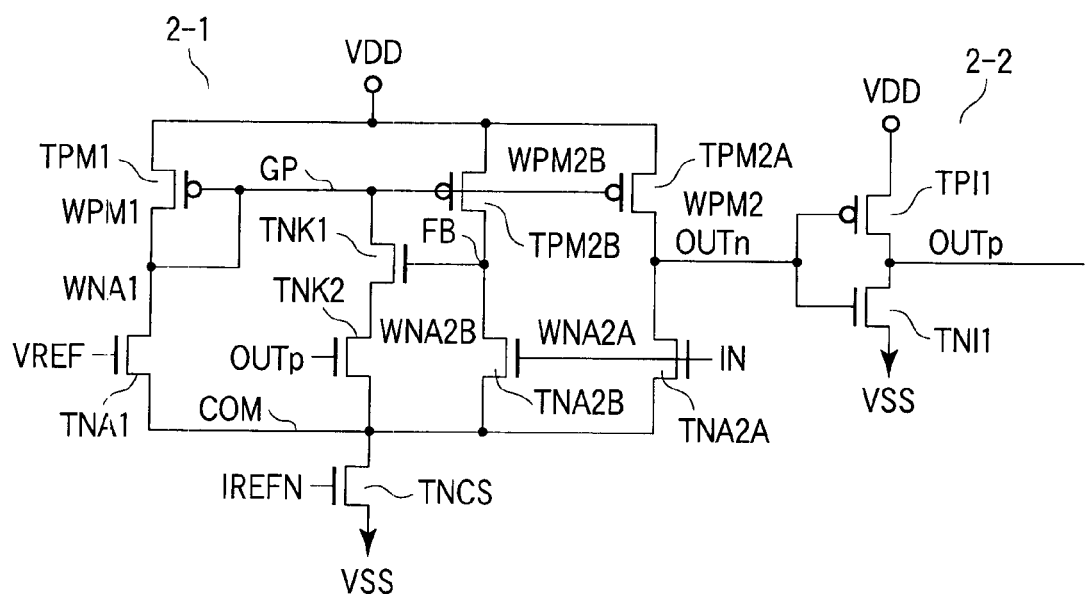
FIG. 3 is a circuit diagram showing the configuration of an input receiver provided on a semiconductor integrated circuit according to a second embodiment.

FIG. 3 is a circuit diagram showing the configuration of an input receiver provided on a semiconductor integrated circuit according to a second embodiment. This input receiver is constituted of a current-mirror differential amplifier 2-1, and inverter 2-2 in the subsequent stage configured to carry out waveform shaping of an output signal of the current-mirror differential amplifier 2-1.

The input receiver of this embodiment differs from the input receiver of the first embodiment shown in FIG. 1 in that the circuit is changed in such a manner that the PMOS transistor TPM2 in the current-mirror differential amplifier is divided into two PMOS transistors TPM2A and TPM2B, PMOS transistor TPM2A is used only for charging a node of an output signal OUTn, and PMOS transistor TPM2B is used only for driving the gate terminal of the NMOS transistor TNK1. Further, concomitantly with this circuit change, the NMOS transistor TNA2 in which the external input signal IN is input to the gate terminal is also divided into two NMOS transistors TNA2A and TNA2B, NMOS transistor TNA2A is connected to the PMOS transistor TPM2A, and NMOS transistor TNA2B is connected to the PMOS transistor TPM2B.

A source terminal of a PMOS transistor TPM1 is connected to a first power source node to which a power source voltage VDD of the positive polarity is supplied, and gate terminal and drain terminal thereof are connected to a node GP. A source terminal of the PMOS transistor TPM2A is connected to the first power source node, drain terminal thereof is connected to a signal output node configured to acquire an output signal OUTn, and gate terminal thereof is connected to the node GP. A source terminal of the PMOS transistor TPM2B is connected to the first power source node, and drain terminal thereof is connected to a node FB to which the gate terminal of the NMOS transistor TNK1 is connected. A drain terminal of an NMOS transistor TNA1 is connected to the drain terminal of the PMOS transistor TPM1, and fixed potential VREF is input to a gate terminal thereof. A drain terminal of the NMOS transistor TNA2A is connected to the signal output node configured to acquire the output signal OUTn, source terminal thereof is connected to a node COM, and the input signal IN is input to a gate terminal thereof. A drain terminal of the NMOS transistor TNA2B is connected to the node FB, source terminal thereof is connected to the node COM, and the input signal IN is input to a gate terminal thereof. A drain terminal of the NMOS transistor TNK1 is connected to the node GP, and gate terminal thereof is connected to the node FB. Further, a drain terminal of the NMOS transistor TNK2 is connected to a source terminal of the NMOS transistor TNK1, drain terminal thereof is connected to the node COM, and a signal OUTp is input to a gate terminal thereof. A drain terminal of an NMOS transistor TNCS is connected to the node COM, source terminal thereof is connected to a second power source node to which a ground voltage VSS is supplied, and a desired bias voltage IREFN is input to a gate terminal thereof.

An input receiver of this embodiment is an input receiver in which the PMOS transistor TPM2 in the current mirror circuit is divided into two PMOS transistors TPM2A and TPM2B, and in terms of the characteristics of the current mirror circuit, for the driving force DPM1, DPM2A or DPM2B of the PMOS transistor TPM1, TPM2A or TPM2B, the following relationship becomes necessary.

$$DPM1=DPM2A+DPM2B \tag{1}$$

In general, the driving force of a MOS transistor is proportional to a transistor width (channel width W), and hence in order to satisfy the formula (1), the following relationship becomes necessary for the transistor widths WPM1, WPM2A, and WPM2B of the PMOS transistors TPM1, TPM2A, and TPM2B.

$$WPM1=WPM2A+WPM2B \tag{2}$$

Further, the input receiver of this embodiment is an input receiver in which the NMOS transistor TNA2 in the differential pair circuit is divided into two NMOS transistors TNA2A and TNA2B, and in terms of the characteristics of the current mirror circuit, for the driving force DNA1, DNA2A or DNA2B of the NMOS transistors TNA1, TNA2A or TNA2B, the following relationship becomes necessary.

$$DNA1=DNA2A+DNA2B \tag{3}$$

Similarly to the previous case, the driving force of a MOS transistor is proportional the transistor width (channel width W), and hence in order to satisfy the formula (3), the following relationship becomes necessary for the transistor widths WNA1, WNA2A, and WNA2B of the NMOS transistors TNA1, TNA2A, and TNA2B.

$$WNA1=WNA2A+WNA2B \tag{4}$$

FIG. 4 is a waveform chart showing changes in potential of main parts of the input receiver shown in FIG. 3, and shows the potential of each of the external input signal IN, output signal OUTn of the current-mirror differential amplifier 2-1, output signal OUTp of the inverter 2-2, and nodes GP, COM, and FB, and the fixed potential VREF. The external input signal IN generally does not take a full swing corresponding to the external I/O voltage. FIG. 4 shows an example of a case where the internal power source voltage VDD is greater than the external I/O voltage.

Although the operation of the input receiver of this embodiment is basically identical with the first embodiment, the PMOS transistor TPM2 is divided into the two PMOS transistors TPM2A and TPM2B, and node FB is separated from the node of the output signal OUTn, and hence the potential of the node FB makes a transition earlier than the potential of the output signal OUTn. As a result of this, it is possible to further accelerate the rise of the output signal OUTn at the fall time of the external input signal IN, and make the transition time difference of the output signal between the rise time and fall time of the external input signal IN smaller than in the conventional input receiver.

Further, when the ratio of the driving force of the PMOS transistor TPM2A to that of the PMOS transistor TPM1, and the ratio of the driving force of the NMOS transistor TNA2A to that of the NMOS transistor TNA1 are made equal to each other, and the ratio of the driving force of the PMOS transistor TPM2B to that of the PMOS transistor TPM1, and the ratio of the driving force of the NMOS transistor TNA2B to that of the NMOS transistor TNA1 are made equal to each other, the variation in the operating point of the current mirror circuit is eliminated, and hence it is possible to obtain circuit characteristics having no hysteresis. That is, for the driving force DPM1, DPM2A or DPM2B of the PMOS transistor TPM1, TPM2A or TPM2B, and driving force DNA1, DNA2A or DNA2B of the NMOS transistors TNA1, TNA2A or TNA2B, the following relationship becomes necessary.

$$DPM2A/DPM1=DNA2A/DNA1 \tag{5}$$

$$DPM2B/DPM1=DNA2B/DNA1 \tag{6}$$

More specifically, when, for example, the driving force of the PMOS transistor TPM1 is set at 1, and driving force of the PMOS transistor TPM2A is set at 0.6, when the driving force of the NMOS transistor TNA1 is set at 1, and driving force of the NMOS transistor TNA2A is set at 0.6, and when the driving force of the FMOS transistor TPM1 is set at 1, and driving force of the PMOS transistor TPM2B is set at 0.4, then when the driving force of the NMOS transistor TNA1 is set at 1, it is sufficient if the driving force of the NMOS transistor TNA2B is set at 0.4.

It should be noted that in this embodiment too, as in the first embodiment, the circuit connection may be changed in such a manner that the NMOS transistor TNK1 is connected on the node COM side, and NMOS transistor TNK2 is connected on the node GP side. Furthermore, as in the first embodiment, the circuit may be changed in such a manner that the current mirror circuit is constituted of NMOS transistors, and the differential pair circuit is constituted of PMOS transistors.

Third Embodiment

In the input receiver of the first embodiment shown in FIG. 1, the case where the source terminal of the NMOS transistor TNK2 operating as a kick transistor is connected to the node COM has been described. In this case, the current flowing between the nodes GP and COM through the NMOS transistors TNK1 and TNK2 connected in series is determined by the bias voltage IREFN input to the gate terminal of the NMOS transistor TNCS which is the constant current source circuit. However, under certain circumstances, it is necessary to control the current flowing through the NMOS transistors TNK1 and TNK2 independently of the NMOS transistor TNCS.

Figure 5:
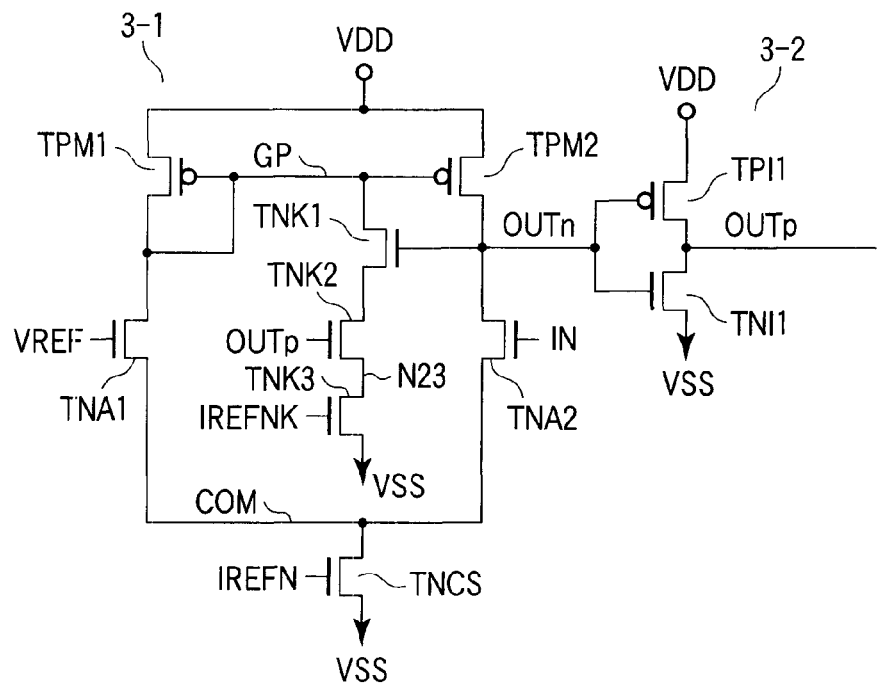
FIG. 5 is a circuit diagram showing the configuration of an input receiver provided on a semiconductor integrated circuit according to a third embodiment.

FIG. 5 is a circuit diagram showing the configuration of an input receiver provided on a semiconductor integrated circuit according to a third embodiment. The input receiver of this embodiment is constituted of a current-mirror differential amplifier 3-1, and inverter 3-2 in the subsequent stage configured to carry out waveform shaping of an output signal of the current-mirror differential amplifier 3-1.

The input receiver of this embodiment differs from the input receiver of the first embodiment shown in FIG. 1 in that an NMOS transistor TNK3 which is a constant current source circuit is inserted between a source terminal of an NMOS transistor TNK2 in the current-mirror differential amplifier, and a second power source node to which the ground voltage VSS is supplied, and desired bias voltage IREFNK different from the bias voltage IREFN is input to a gate terminal of the NMOS transistor TNK3. It should be noted that a basic operation of the input receiver of this embodiment is identical with the first embodiment, and hence a description thereof is omitted.

Owing to the configuration described above, it is possible to control a current flowing between the node GP and ground voltage VSS through the NMOS transistors TNK1, TNK2, and TNK3 which are connected in series by the bias voltage IREFNK input to the gate terminal of the NMOS transistor TNK3. However, a connection node N23 of the source terminal of the NMOS transistor TNK2 and drain terminal of the NMOS transistor TNK3 has small load capacity unlike the node COM, and hence is subject to noise in some cases. In such a case, it is sufficient if load capacity is added to the node N23.

It should be noted that in this embodiment too, the connection order of the three NMOS transistors TNK1, TNK2, and TNK3 to be inserted between the node GP and the second power source node to which the ground voltage VSS is supplied may be changed. Furthermore, as in the first embodiment, the circuit may be changed in such a manner that the current mirror circuit is constituted of NMOS transistors, and the differential pair circuit is constituted of PMOS transistors.

Furthermore, in this embodiment, the circuit connection may be changed in such a manner that the NMOS transistor TNK3 which is the constant current source circuit is omitted, and the source terminal of the NMOS transistor TNK2 is connected to the second power source node to which the ground voltage VSS is supplied. When the NMOS transistor TNK3 is omitted, the current flowing through the two NMOS transistors TNK1 and TNK2 is not limited, and a current corresponding to the characteristics of the NMOS transistors TNK1 and TNK2 flows through them.

Fourth Embodiment

Figure 6:
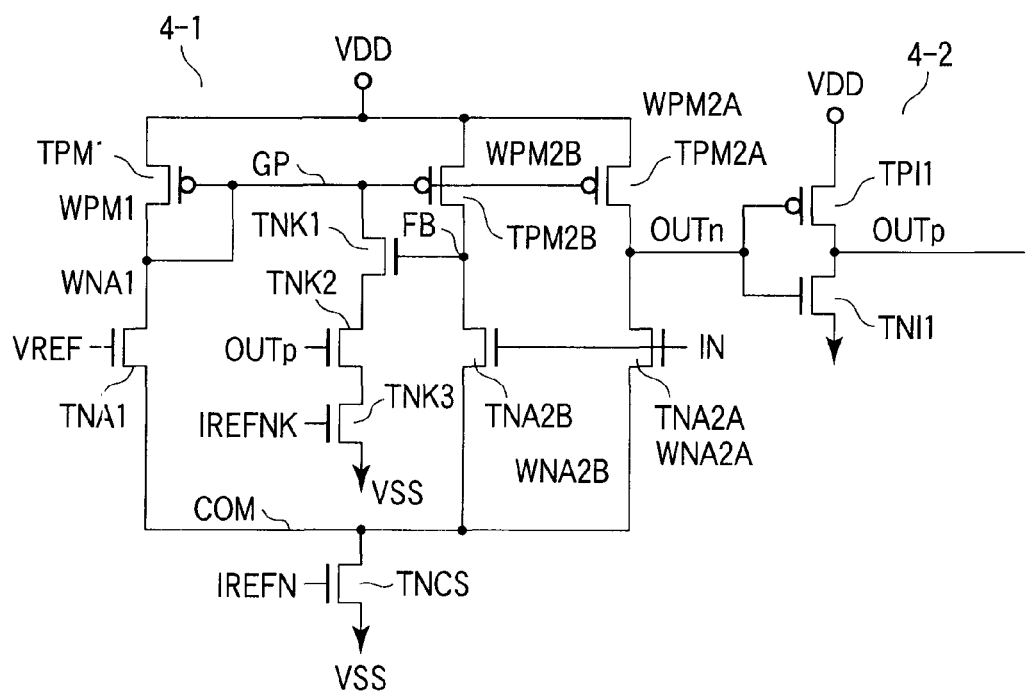
FIG. 6 is a circuit diagram showing the configuration of an input receiver provided on a semiconductor integrated circuit according to a fourth embodiment.

FIG. 6 is a circuit diagram showing the configuration of an input receiver provided on a semiconductor integrated circuit according to a fourth embodiment. The input receiver of this embodiment is constituted of a current-mirror differential amplifier 4-1, and inverter 4-2 in the subsequent stage configured to carry out waveform shaping of an output signal of the current-mirror differential amplifier 4-1.

The input receiver of this embodiment is an input receiver in which, a circuit change, similarly to the second embodiment of FIG. 3, of dividing the PMOS transistor TPM2 in the current-mirror differential amplifier into two PMOS transistors TPM2A and TPM2B, and circuit change, similarly to the third embodiment of FIG. 5, of inserting an NMOS transistor TNK3 that is a constant current source circuit between a source terminal of an NMOS transistor TNK2 in the current-mirror differential amplifier, and a second power source node to be supplied with a ground voltage VSS, and inputting a desired bias voltage IREFNK different from the bias voltage IREFN to a gate terminal of the NMOS transistor TNK3, are added to the input receiver of the first embodiment of FIG. 1. It should be noted that a basic operation of the input receiver of this embodiment is identical with the second embodiment, and hence a description thereof is omitted.

In this embodiment too, as in the second embodiment, the advantage that it is possible to further accelerate the rise of the output signal OUTn at the fall time of the external input signal IN, and make the transition time difference of the output signal between the rise time and fall time of the external input signal IN smaller than in the conventional input receiver can be obtained. Further, in addition to the above advantage, as in the third embodiment, the advantage that the current flowing between the node GP and ground voltage VSS through the NMOS transistors TNK1, TNK2, and TNK3 which are connected in series can be controlled independently of the NMOS transistor TNCS can be obtained.

It should be noted that in this embodiment too, the connection order of the three NMOS transistors TNK1, TNK2, and TNK3 to be inserted between the node GP and the second power source node to which the ground voltage VSS is supplied may be changed. Furthermore, as in the first embodiment, the circuit may be changed in such a manner that the current mirror circuit is constituted of NMOS transistors, and the differential pair circuit is constituted of PMOS transistors.

Furthermore, in this embodiment, the circuit may be changed in such a manner that the NMOS transistor TNK3 which is the constant current source circuit is omitted, and the source terminal of the NMOS transistor TNK2 is connected to the second power source node to which the ground voltage VSS is supplied.

Fifth Embodiment

Figure 7:
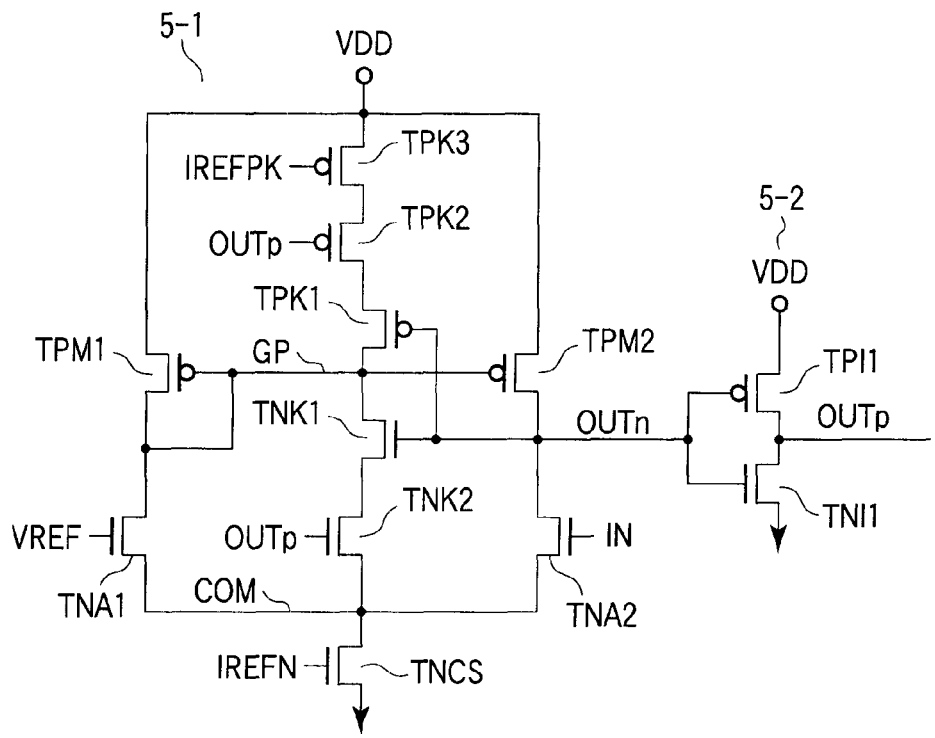
FIG. 7 is a circuit diagram showing the configuration of an input receiver provided on a semiconductor integrated circuit according to a fifth embodiment.

FIG. 7 is a circuit diagram showing the configuration of an input receiver provided on a semiconductor integrated circuit according to a fifth embodiment. The input receiver of this embodiment is constituted of a current-mirror differential amplifier 3-1, and inverter 5-2 in the subsequent stage configured to carry out waveform shaping of an output signal of the current-mirror differential amplifier 5-1.

The input receiver of this embodiment differs from the input receiver of the first embodiment shown in FIG. 1 in that a rise of an output signal OUTn of a current-mirror differential amplifier 5-1 from "H" to "L" is also accelerated when an external input signal IN changes from "L" to "H".

In order to realize this, in the current-mirror differential amplifier 5-1, three PMOS transistors TPK1, TPK2, and TPK3 operating as kick transistors configured to raise the potential of a node GP are added to the current-mirror differential amplifier of the first embodiment. A drain terminal of the PMOS transistor TPK1 is connected to the node GP, and gate terminal thereof is connected to a node of the signal OUTn. A drain terminal of the PMOS transistor TPK2 is connected to a source terminal of the PMOS transistor TPK1, and gate terminal thereof is connected to a node of a signal OUTp. A drain terminal of the PMOS transistor TPK3 is connected to a source terminal of the PMOS transistor TPK2, and source terminal thereof is connected to a first power source node to which a power source voltage VDD is supplied, and desired bias voltage IREFPK is input to a gate terminal thereof. Here, the PMOS transistor TPK3 constitutes a constant current source circuit, and limits a current flowing between the first power source node and node GP through the three PMOS transistors TPK1, TPK2, and TPK3 which are connected in series. An inverter 5-2 is, as in the first embodiment, constituted of a PMOS transistor TP11 and NMOS transistor TN11.

In such a configuration, as in the first embodiment, at the fall time of an external input signal IN, when the output signal OUTn of the current-mirror differential amplifier 5-1 has risen to a certain degree, NMOS transistors TNK1 and TNK2 operate as kick transistors to lower the potential of the node GP, and hence the rise of the output signal OUTn is accelerated.

When the external input signal IN is in the "L" state, the output signal OUTn of the current-mirror differential amplifier 5-1 is in the "H" state, and output signal OUTp of the inverter 5-2 is in the "L" state. At this time, although the PMOS transistor TPK2 is in the on-state, the PMOS transistor TPK1 is in the off-state, and hence the current pathway between the VDD node and node GP formed of a series circuit constituted of the PMOS transistors TPK1, TPK2, and TPK3 is in the off-state.

Then, when the external input signal IN changes from "L" to "H", and potential of the signal IN exceeds the fixed potential VREF, a current flowing through the NMOS transistor TNA2 becomes greater than that of the NMOS transistor TNA1, and the potential of the output signal OUTn of the current-mirror differential amplifier 5-1 lowers. Further, when the potential of the output signal OUTn becomes lower than the absolute value of a threshold voltage of the PMOS transistor TPK1, the PMOS transistor TPK1 starts to be in the on-state, a current flows through the series circuit constituted of the PMOS transistors TPK1, TPK2, and TPK3, and the potential of the node GP is raised. As a result of this, the current flowing through the PMOS transistor TPM2 becomes less, and the fall of the output signal OUTn is accelerated.

In this embodiment too, it is possible to make the transition time difference of the output signal between the rise time and fall time of the external input signal IN smaller than in the conventional input receiver, and adjust the transition time of the output signal at the rise time of the input signal IN.

It should be noted that in this embodiment, the connection order of the three PMOS transistors TPK1, TPK2, and TPK3 to be inserted between the first power source node and node GP may be changed. Furthermore, as in the first embodiment, the circuit may be changed in such a manner that the current mirror circuit is constituted of NMOS transistors, and the differential pair circuit is constituted of PMOS transistors.

Furthermore, in this embodiment, the circuit may be changed in such a manner that the PMOS transistor TPK3 which is the constant current source circuit is omitted, and source terminal of the PMOS transistor TPK2 is connected to the first power source node.

Sixth Embodiment

Figure 8:
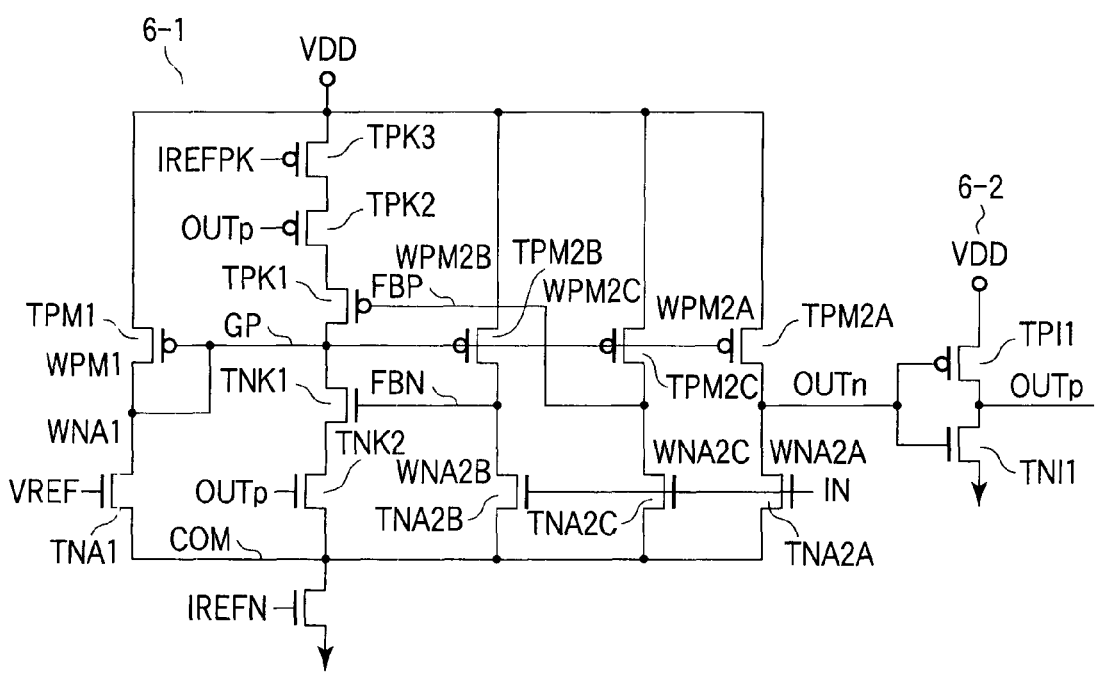
FIG. 8 is a circuit diagram showing the configuration of an input receiver provided on a semiconductor integrated circuit according to a sixth embodiment.

FIG. 8 is a circuit diagram showing the configuration of an input receiver provided on a semiconductor integrated circuit according to a sixth embodiment. The input receiver of this embodiment is constituted of a current-mirror differential amplifier 6-1, and inverter 6-2 in the subsequent stage configured to carry out waveform shaping of an output signal of the current-mirror differential amplifier 6-1.

The input receiver of this embodiment is an input receiver corresponding to the input receiver of the fifth embodiment shown in FIG. 7 changed in such a manner that in place of driving the gate of each of the NMOS transistor TNK1 and PMOS transistor TPK1 by the rode of the output signal OUTn having large load capacity, the gate of each of the NMOS transistor TNK1 and PMOS transistor TPK1 is driven by a signal of a node having the same logic as the output signal OUTn, and having small load capacity.

That is, in this embodiment, the PMOS transistor TPM2 (FIG. 7) in the current-mirror differential amplifier is divided into three PMOS transistors TPM2A, TPM2B, and TPM2C, the PMOS transistor TPM2A is used only for charging the node of the signal OUTn, PMOS transistor TPM2B is used only for driving a gate terminal of the NMOS transistor TNK1, and PMOS transistor TPM2C is used only for driving a gate terminal of the PMOS transistor TPK1. Further, concomitantly with this, the NMOS transistor TNA2 (FIG. 7) in the differential pair circuit in which the external input signal IN is input to the gate terminal is also divided into three NMOS transistors TNA2A, TNA2B, and TNA2C, NMOS transistor TNA2A is connected to the PMOS transistor TPM2A, NMOS transistor TNA2B is connected to the PMOS transistor TPM2B, and NMOS transistor TNA2C is connected to the PMOS transistor TPM2C.

In the input receiver of this embodiment, the PMOS transistor TPM2 constituting a transistor of the current mirror circuit is divided into three PMOS transistors TPM2A, TPM2B, and TPM2C, and in terms of the characteristics of the current mirror circuit, for the driving force DPM1, DPM2A, DPM2B or TPM2C of the PMOS transistor TPM1, TPM2A, TPM2B or TPM2C, the following relationship becomes necessary.

$$DPM1 = DPM2A + DPM2B + TPM2C \qquad (7)$$

In general, the driving force of a MOS transistor is proportional to a transistor width (channel width W), and hence in order to satisfy the formula (7), the following relationship becomes necessary for the transistor widths WPM1, WPM2A, WPM2B, and WPM2C of the PMOS transistors TPM1, TPM2A, TPM2B, and TPM2C.

$$WPM1 = WPM2A + WPM2B + WPM2C \qquad (8)$$

Further, in the input receiver of this embodiment, the NMOS transistor TNA2 of the differential pair circuit is divided into three NMOS transistors TNA2A, TNA2B, and TNA2C, and in terms of the characteristics of the current mirror circuit, for the driving force DNA1, DNA2A, DNA2B or DNA2C of the NMOS transistor TNA1, TNA2A, TNA2B or TNA2C, the following relationship becomes necessary.

$$DNA1 = DNA2A + DNA2B + DNA2C \qquad (9)$$

Similarly to the previous case, the driving force of a MOS transistor is proportional to the transistor width (channel width W), and hence in order to satisfy the formula (9), the following relationship becomes necessary for the transistor widths WNA1, WNA2A, WNA2B, and WNA2C of the NMOS transistors TNA1, TNA2A, TNA2B, and TNA2C.

$$WNA1 = WNA2A + WNA2B + WNA2C \qquad (10)$$

Further, when the ratio of the driving force of the PMOS transistor TPM2A to that of the PMOS transistor TPM1, and the ratio of the driving force of the NMOS transistor TNA2A to that of the NMOS transistor TNA1 are made equal to each other, the ratio of the driving force of the PMOS transistor TPM2B to that of the PMOS transistor TPM1, and the ratio of the driving force of the NMOS transistor TNA2B to that of the NMOS transistor TNA1 are made equal to each other, and the ratio of the driving force of the PMOS transistor TPM2C to that of the PMOS transistor TPM1, and ratio of the driving force of the NMOS transistor TNA2C to that of the NMOS transistor TNA1 are made equal to each other, the variation in the operating point of the current mirror circuit is eliminated, and hence it is possible to obtain circuit characteristics having no hysteresis. That is, for the driving force DPM1, DPM2A, DPM2B or DPM2C of the PMOS transistor TPM1, TPM2A, TPM2B or TPM2C, and driving force DNA1, DNA2A, DNA2B or DNA2C of the NMOS transistor TNA1, TNA2A, TNA2B or TNA2C, the following relationships become necessary.

$$DPM2A/DPM1 = DNA2A/DNA1 \qquad (11)$$

$$DPM2B/DPM1 = DNA2B/DNA1 \qquad (12)$$

$$DPM2C/DPM1 = DNA2C/DNA1 \qquad (13)$$

Figure 9:
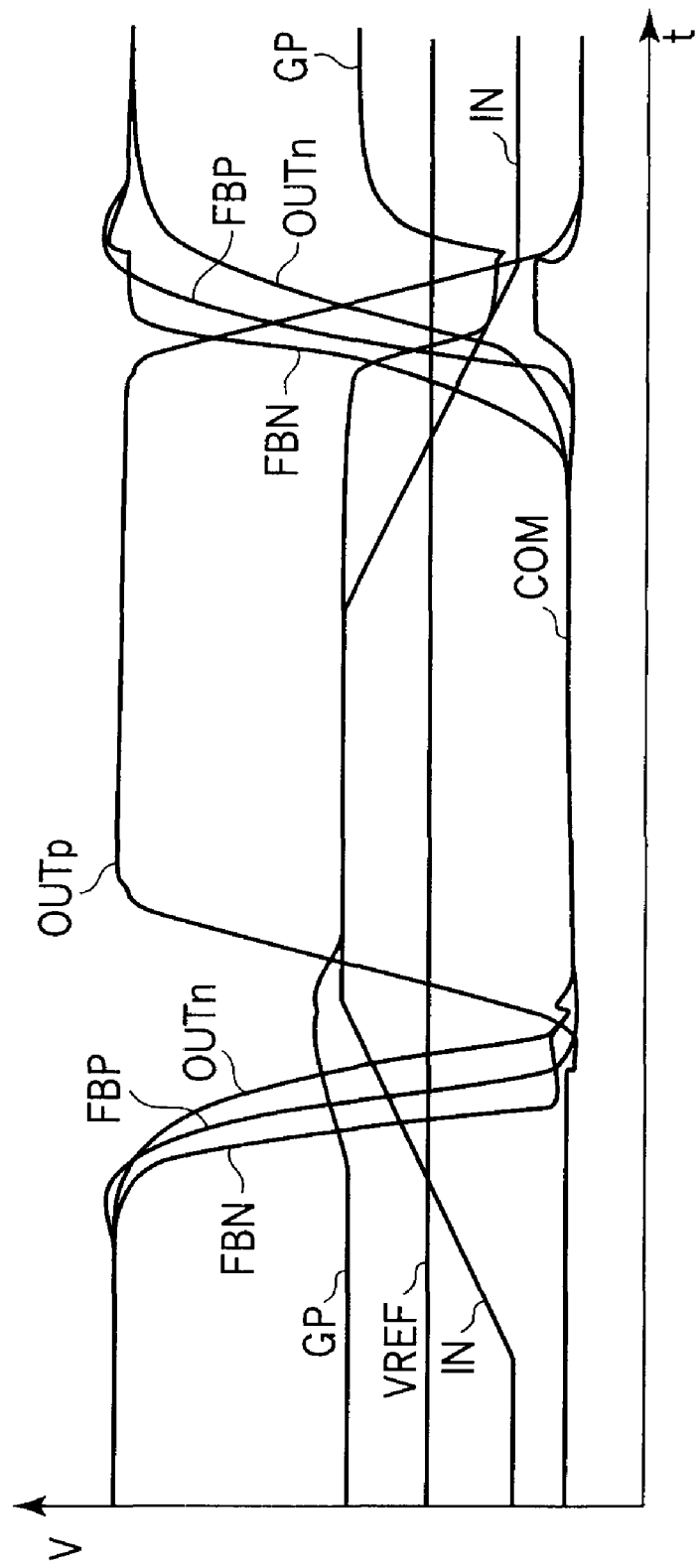
FIG. 9 is a waveform chart showing changes in potential of main parts of the input receiver shown in FIG. 8.

FIG. 9 is a waveform chart showing changes in potential of main parts of the input receiver of this embodiment, and shows an external input signal IN, output signal OUTn of the current-mirror differential amplifier 6-1, output signal OUTp of the inverter 6-2, potential of each of the nodes GP and COM, potential of each of nodes FBN and FBP which are nodes of drain terminals of the PMOS transistors TPM2B and TPM2C, respectively, and fixed potential VREF. The external input signal IN generally does not take a full swing corresponding to the external I/O voltage. FIG. 9 shows an example of a case where the internal power source voltage VDD is greater than the external I/O voltage.

Although the operation of the input receiver of this embodiment is basically identical with the fifth embodiment shown in FIG. 7, the PMOS transistor TPM2 is divided into the three PMOS transistors TPM2A, TPM2B, and TPM2C, and node FBN and node FBP are separated from the node of the output signal OUTn, and hence the potential of each of the node FBN and node FBP makes a transition earlier than the potential of the output signal OUTn.

According to this embodiment, it is possible to make the transition time difference of the output signal between the rise time and fall time of the external input signal IN smaller than the conventional input receiver.

Further, when the ratio of the driving force of the PMOS transistor TPM2A to that of the PMOS transistor TPM1, and the ratio of the driving force of the NMOS transistor TNA2A to that of the NMOS transistor TNA1 are made equal to each other, the ratio of the driving force of the PMOS transistor TPM2B to that of the PMOS transistor TPM1, and the ratio of the driving force of the NMOS transistor TNA2B to that of the NMOS transistor TNA1 are made equal to each other, and the ratio of the driving force of the PMOS transistor TPM2C to that of the PMOS transistor TPM1, and the ratio of the driving force of the NMOS transistor TNA2C to that of the NMOS transistor TNA1 are made equal to each other, the variation in the operating point of the current mirror circuit is eliminated, and hence it is possible to obtain circuit characteristics having no hysteresis.

It should be noted that in this embodiment too, as in the fifth embodiment, the connection order of the three PMOS transistors TPK1, TPK2, and TPK3 to be inserted between the first power source node and node GP may be changed. Furthermore, as in the first embodiment, the circuit may be changed in such a manner that the current mirror circuit is constituted of NMOS transistors, and the differential pair circuit is constituted of PMOS transistors.

FIG. 10 is a block diagram showing a configuration example of a solid state drive (SSD) to which a semiconductor integrated circuit including the level shift circuit of the embodiments is applied. The SSD is formed by, for example, using a NAND flash memory and is developed as a substitution of a hard disk device. An SSD 100 is connected to a host device (that is simply referred to as a host) 12 such as a CPU core or personal computer via a memory connection interface such as an ATA interface (ATA I/F) 11 and functions as an external memory of the host 12. Further, the SSD 100 can transfer data with respect to a debugging/manufacture checking device 200 via a communication interface 13 such as an RS232C interface (RS232C I/F).

The SSD 100 includes a NAND flash memory (that is hereinafter referred to as a NAND memory) 14 as a nonvolatile semiconductor memory, a drive control circuit 15 as a controller, a DRAM 20 as a volatile semiconductor memory, a power source circuit 16, state display LED 17, a temperature sensor 18 that detects an internal temperature of the drive control circuit 15 and a fuse 19.

The power source circuit 16 generates a plurality of different internal DC power source voltages from an external DC power source voltage supplied from a power source circuit on the host 12 side and supplies the respective internal DC power source voltages to the respective circuits in the SSD 100. Further, the power source circuit 16 detects a rise of the external power source voltage, generates a power-on reset signal and supplies the same to the drive control circuit 15.

The fuse 19 is provided between the power source circuit on the host 12 side and the power source circuit 16 inside the SSD 100. When an overcurrent is supplied from the external power source circuit, the fuse 19 is cut off to prevent the internal circuits from performing erroneous operations.

For example, the NAND memory 14 includes four parallel operation elements 14a, 14b, 14c, 14d that perform parallel operations and the parallel operation elements 14a, 14b, 14c, 14d are connected to the drive control circuit 15 via channels ch0, ch1, ch2, ch3, respectively. Each of the parallel operation elements 14a to 14d includes a plurality of banks capable of bank interleaving. That is, for example, each of the parallel operation elements includes four banks Bank0, Bank1, Bank2, Bank3, and each bank includes a plurality of NAND memory chips, for example, two memory chips Chip0, Chip1.

Each memory chip is divided into two regions (districts), plane 0 and plane 1, each including a plurality of physical blocks, for example. The plane 0 and plane 1 include peripheral circuits, for example, row decoders, column decoders, page buffers, data caches (not shown) and the like that are independent from one another and the erase/write/read operations can be simultaneously performed for the plane 0 and plane 1 by using a double-speed mode.

Thus, the respective NAND memory chips of the NAND memory 14 can perform the parallel operations by means of a plurality of channels. Further, the bank interleave operation by means of a plurality of banks, the interleave operation of a plurality of chips in the same bank and the parallel operation in the double-speed mode by use of a plurality of planes can be performed. In this case, each memory chip may have a configuration that is divided into two or more planes or that is not divided at all.

The DRAM 20 functions as a data transfer cache and work area memory between the host 12 and the NAND memory 14. For example, the content stored in the work area memory of the DRAM 20 may include log information indicating that each type of management table stored in the NAND memory 14 has an alteration difference of the management table or a master table (snap shot) developed at the start time.

A nonvolatile random access memory such as an FeRAM (Ferroelectric Random Access Memory), MRAM (Magnetoresistive Random Access Memory) or PRAM (Phase change Random Access Memory) can be used instead of the DRAM 20. If the nonvolatile random access memory is used, a portion or all of the operations of saving the various management tables in the NAND memory 14 at the power-off time can be omitted.

The drive control circuit 15 controls data transfer between the host 12 and the NAND memory 14 via the DRAM 20 and controls the respective constituents of the SSD 100. Further, the drive control circuit 15 also has a function of supplying a status display signal to the state display LED 17 and supplying a reset signal and clock signal to the respective portions in the drive control circuit 15 and SSD 100 in response to a power-on reset signal from the power source circuit 16.

Each of the NAND memory chips is formed by arranging a plurality of physical blocks each of which is set as the data erase unit.

Figure 11:
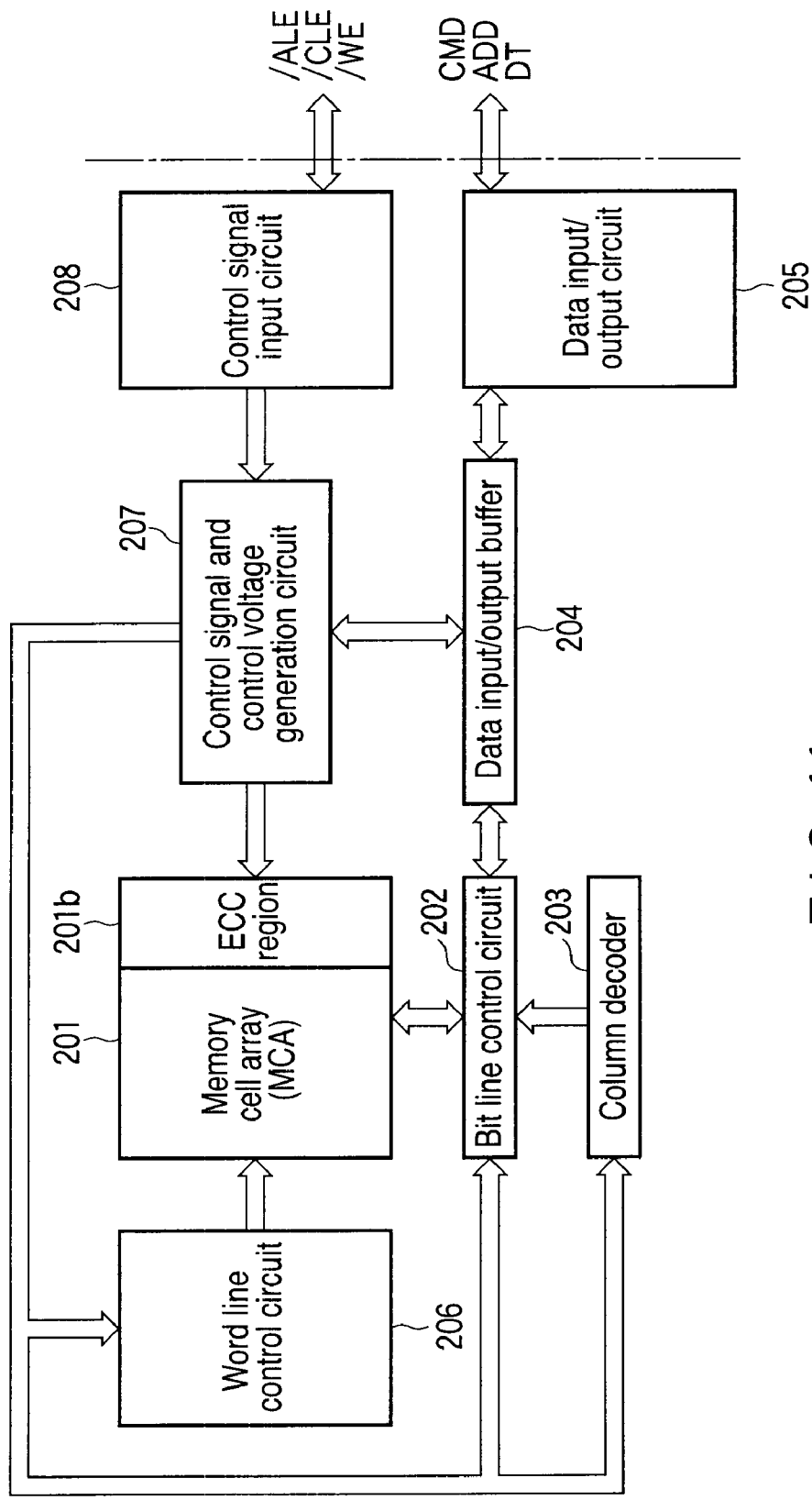
FIG. 11 is a functional block diagram showing an example of a NAND flash memory included in a NAND memory chip shown in FIG. 10.

FIG. 11 is a function block diagram showing an example of a NAND flash memory contained in one NAND memory chip in the SSD 100 shown in FIG. 10.

A memory cell array 201 is formed by arranging electrically data rewritable memory cells formed of, for example, EEPROM cells in a matrix form and is connected to a plurality of bit lines, a plurality of word lines and one common source line. The memory cell array 201 is connected to a bit line control circuit 202 that controls the bit lines and a word line control circuit 206 that controls the word lines.

The bit line control circuit 202 reads data of a memory cell of the memory cell array 201 via the bit line, detects the state of the memory cell of the memory cell array 201 via the bit line and writes data in the memory cell by applying a write control voltage to the memory cell of the memory cell array

201 via the bit line. The bit line control circuit 202 is connected to a column decoder 203 and data input/output buffer 204.

A data storage circuit (not shown) in the bit line control circuit 202 is selected by means of the column decoder 203. Data read from the memory cell to the data storage circuit is output to the exterior from the data input/output circuit 205 via the data input/output buffer 204. The data input/output circuit 205 is connected to the drive control circuit 15 (FIG. 10) arranged outside the memory chip.

The drive control circuit 15 receives data output from the data input/output circuit 205. Further, the drive control circuit 15 outputs various commands CMD, address ADD and data DT used to control the operation of the NAND flash memory. Write data input from the drive control circuit 15 to the data input/output circuit 205 is supplied to the data storage circuit in the bit line control circuit 202 that is selected by means of the column decoder 203 via the data input/output buffer 204 and the command and address are supplied to a control signal and control voltage generation circuit 207.

The word line control circuit 206 is connected to the memory cell array 201. The word line control circuit 206 selects a word line in the memory cell array 201 and applies a voltage required for reading, writing or erasing to the selected word line.

The memory cell array 201, bit line control circuit 202, column decoder 203, data input/output buffer 204 and word line control circuit 206 are connected to the control signal and control voltage generation circuit 207 and are controlled by the control signal and control voltage generation circuit 207.

The control signal and control voltage generation circuit 207 is connected to a control signal input circuit 208 and controlled by various control signals such as ALE (address•latch•enable), CLE (command•latch•enable) and WE (write•enable) input from the drive control circuit 15 via the control signal input circuit 208 and command CMD input from the drive control circuit 15 via the data input/output circuit 205 and data input/output buffer 204.

The control signal and control voltage generation circuit 207 generates a word line drive voltage and bit line drive voltage at the data write time and also generates a voltage to be supplied to a well. The control signal and control voltage generation circuit 207 includes a booster circuit such as a charge pump circuit to generate a program voltage, read voltage and erase voltage.

Further, the control signal and control voltage generation circuit 207 can change the level of a read voltage to be generated. That is, the control signal and control voltage generation circuit 207 has a function of shifting a voltage applied to a word line in a (+) direction or (−) direction at the read operation time in response to various control signals input via the control signal input circuit 208 and command CMD input via the data input/output circuit 205 and data input/output buffer 204.

The bit line control circuit 202, column decoder 203, word line control circuit 206 and control signal and control voltage generation circuit 207 form a write circuit and read circuit.

The memory cell array 201 includes a storage area 201*b* that stores an ECC (Error Correction Code) in addition to a storage area used to store main data.

Figure 12:
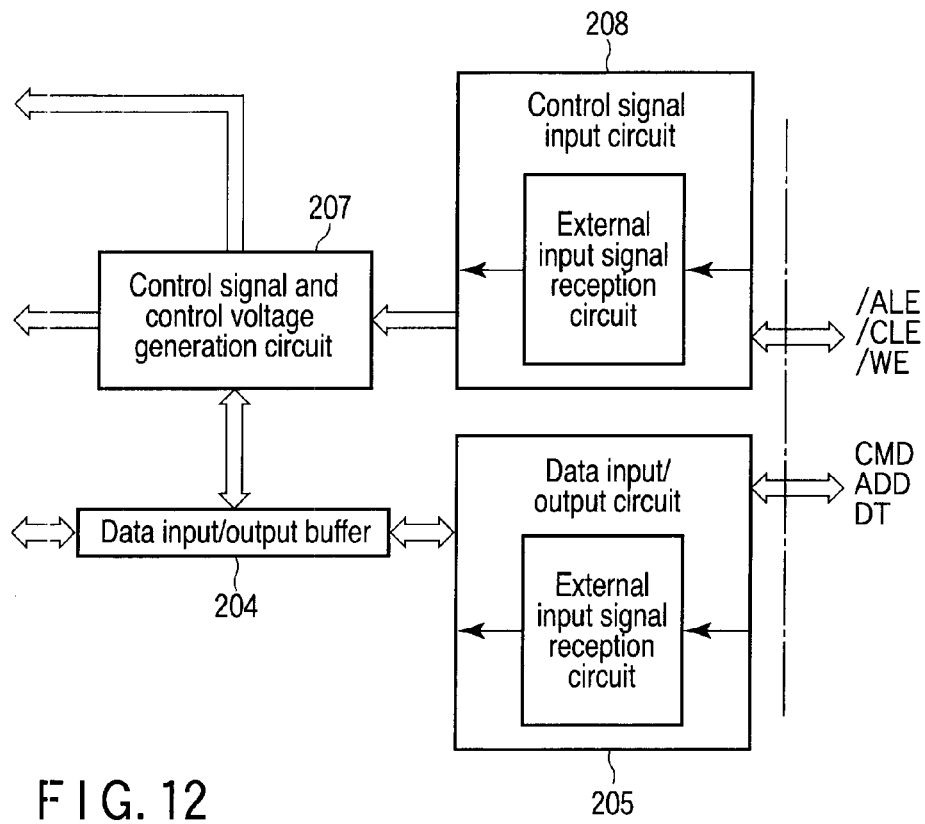
FIG. 12 is a view showing a part of the functional blocks shown in FIG. 11.

As shown in FIG. 12, each of the input receivers described in the first to six embodiments is provided in the data input/output circuit 205 and control signal input circuit 208 of the NAND memory chip shown in FIG. 11 to receive a control signal and data supplied from the chip exterior as an external input signal.

Figure 13:
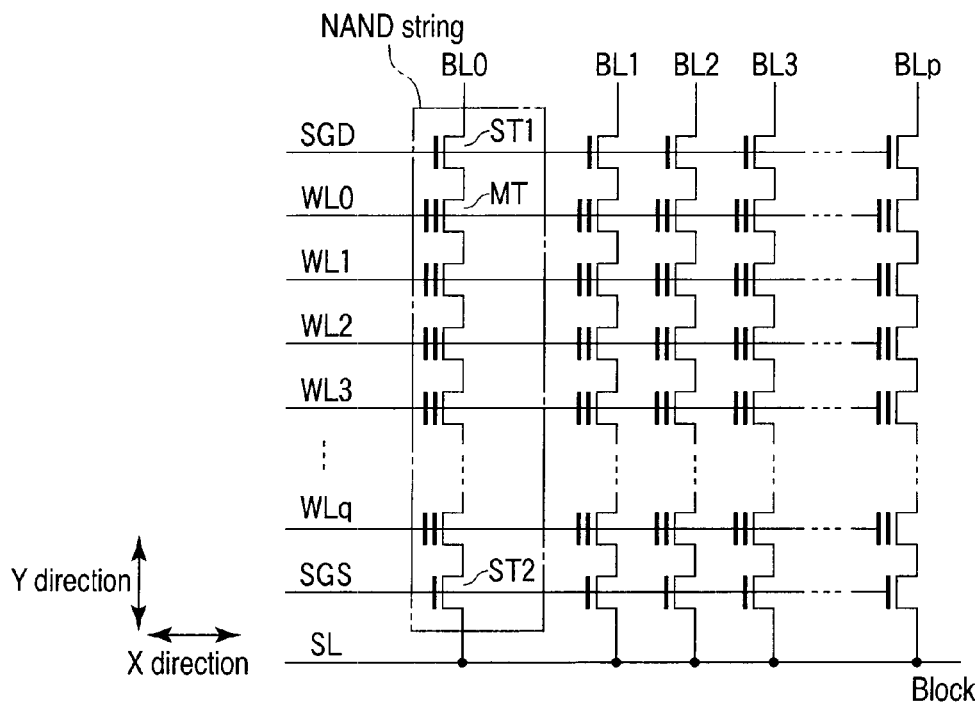
FIG. 13 is a circuit diagram showing a configuration example of a physical block included in a NAND memory chip shown in FIG. 10.

FIG. 13 is a circuit diagram showing a configuration example of one physical block contained in one NAND memory chip of the SSD shown in FIG. 10. The physical block includes (p+1) NAND strings sequentially arranged in an X direction (p is an integral number not smaller than 0). Select transistors ST1, ST2 are respectively provided at one end and at the other end of each NAND string. The drains of the select transistors ST1 of the (p+1) NAND strings are respectively connected to bit lines BL0 to BLp and the gates thereof are commonly connected to a select gate line SGD. Further, the sources of the select transistors ST2 are commonly connected to a source line SL and the gates thereof are commonly connected to a select gate line SGS.

Each memory cell transistor (or each memory cell) MT is formed by a MOSFET (Metal Oxide Semiconductor Field Effect Transistor) having a stacked gate structure formed on a semiconductor substrate. The stacked gate structure includes a charge storage layer (floating gate electrode) formed above the semiconductor substrate with a gate insulating film disposed therebetween and a control gate electrode formed above the charge storage layer with a gate-gate insulating film disposed therebetween. The threshold voltage of the memory cell transistor MT varies according to the number of electrons stored in the floating gate electrode and the memory cell stores data according to a difference in the threshold voltage. The memory cell transistor MT may be formed to store one bit or multi-value data (data of two or more bits).

Further, the memory cell transistor MT is not limited to the structure having the floating gate electrode but may have a structure such as a MONOS (Metal-Oxide-Nitride-Oxide-Silicon) structure in which the threshold voltage may be adjusted by trapping electrons in the interface of the nitride film used as a charge storage layer. Likewise, the memory cell transistor MT of the MONOS structure may be formed to store one bit or multi-value data (data of two or more bits).

The (q+1) memory cell transistors MT in each NAND string are arranged with the current paths thereof serially connected between the source of the select transistor ST1 and the drain of the select transistor ST2. That is, a plurality of memory cell transistors MT are serially connected in a Y direction while every adjacent two of them commonly use a diffusion region (source region or drain region).

In the respective NAND strings, the control gate electrodes of the memory cell transistors MT are respectively connected to word lines WL0 to WLq in an order from the memory cell transistors MT that are arranged in the nearest positions of the bit lines BL0 to BLp towards the memory cell transistors MT that are arranged in the nearest position of the source line SL. Therefore, the drain of the memory cell transistor MT that is connected to the word line WL0 is connected to the source of the select transistor ST1 and the source of the memory cell transistor MT that is connected to the word line WLq is connected to the drain of the select transistor ST2.

Each of the word lines WL0 to WLq is commonly connected to the control gate electrodes of those of the memory cell transistors MT that are arranged on the same row in the NAND strings of the physical block. That is, the control gate electrodes of those of the memory cell transistors MT that are arranged on the same row in the block are connected to a corresponding one of the word lines WL. The (p+1) memory cell transistors MT connected to the same word line WL are dealt with as one page (physical page) and data write and data read operations are performed for each physical page.

Further, the bit lines BL0 to BLq are each commonly connected to the drains of the select transistors ST1 in the blocks. That is, the NAND strings lying on the same column in a plurality of blocks are connected to a corresponding one of the bit lines BL.

With the embodiments described above, a difference in the transition time at the rise time and at the fall time of an input signal can be made small.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a first transistor of a first channel type, a source terminal of which is connected to a first power source node, a gate terminal and a drain terminal of which are connected to a first node;
   a second transistor of the first channel type, a source terminal of which is connected to the first power source node, a drain terminal of which is connected to a signal output node, a gate terminal of which is connected to the first node, and which constitutes a current mirror circuit together with the first transistor;
   a third transistor of a second channel type, a drain terminal of which is connected to the drain terminal of the first transistor, and to a gate terminal of which a first external signal is input;
   a fourth transistor of the second channel type, a drain terminal of which is connected to the signal output terminal, a source terminal of which is connected to a source terminal of the third transistor, to a gate terminal of which a second external signal is input, and which constitutes a differential pair circuit together with the third transistor;
   a first constant current source circuit, one end of which is connected to the source terminals of the third and fourth transistors, and the other end of which is connected to a second power source node;
   a fifth transistor of the second channel type, a current pathway of which between a source terminal and a drain terminal is inserted between the first node and the one end of the first constant current source circuit, and a gate terminal of which is connected to the signal output node; and
   a sixth transistor of the second channel type, a current pathway of which between a source terminal and a drain terminal is connected in series to the current pathway between the source terminal and the drain terminal of the fifth transistor, and to a gate terminal of which a signal of logic opposite to a signal to be obtained at the signal output node is input.

2. The semiconductor integrated circuit according to claim 1, wherein
   one end of the current pathway between the source terminal and the drain terminal of the fifth transistor is connected to the first node, one end of the current pathway between the source terminal and the drain terminal of the sixth transistor is connected to the other end of the current pathway between the source terminal and the drain terminal of the fifth transistor, and the other end of the current pathway between the source terminal and the drain terminal of the sixth transistor is connected to the one end of the first constant current source circuit.

3. The semiconductor integrated circuit according to claim 1, further comprising:
   a seventh transistor of the first channel type, a current pathway of which between a source terminal and a drain terminal is inserted between the first power source node and the first node, and a gate terminal of which is connected to the signal output node; and
   an eighth transistor of the first channel type, a current pathway of which between a source terminal and a drain terminal is connected in series to the current pathway between the source terminal and the drain terminal of the seventh transistor, and to a gate terminal of which a signal of logic opposite to a signal to be obtained at the signal output node is input.

4. The semiconductor integrated circuit according to claim 3, further comprising a second constant current source circuit connected in series to both the current pathways between the source terminal and the drain terminal of the seventh transistor, and between the source terminal and the drain terminal of the eighth transistor.

5. The semiconductor integrated circuit according to claim 1, wherein
   the first external signal is a signal of fixed potential, and the second external signal is a signal potential of which changes in terms of time.

6. The semiconductor integrated circuit according to claim 1, wherein
   the semiconductor integrated circuit is part of an input receiver configured to receive the second external signal from the outside of the chip, and transmit the received signal to the inside of the chip.

7. The semiconductor integrated circuit according to claim 1, wherein
   when the second external signal changes from an "H" state to an "L" state, the fifth transistor and the sixth transistor operate to lower the potential of the first node, and accelerate a rise of the output signal of the signal output node.

8. The semiconductor integrated circuit according to claim 1, further comprising an inverter of the subsequent stage configured to carry out waveform shaping of the output signal of the signal output node.

* * * * *